(12) United States Patent
Gailhard

(10) Patent No.: US 10,530,374 B2
(45) Date of Patent: Jan. 7, 2020

(54) METHOD FOR MANAGING A PHASE-LOCKED LOOP AND RELATED CIRCUIT

(71) Applicant: STMicroelectronics (Rousset) SAS, Rousset (FR)

(72) Inventor: Bruno Gailhard, Rognes (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 0 days.

(21) Appl. No.: 16/289,225

(22) Filed: Feb. 28, 2019

(65) Prior Publication Data
US 2019/0296753 A1    Sep. 26, 2019

(30) Foreign Application Priority Data

Mar. 21, 2018    (FR) ...................... 18 52413

(51) Int. Cl.
*H03L 7/10* (2006.01)
*H03L 7/14* (2006.01)
*H03L 7/089* (2006.01)
*H03L 7/099* (2006.01)

(52) U.S. Cl.
CPC ............ *H03L 7/148* (2013.01); *H03L 7/0891* (2013.01); *H03L 7/0992* (2013.01)

(58) Field of Classification Search
USPC .................................. 327/147–149, 156–158
See application file for complete search history.

(56) References Cited

U.S. PATENT DOCUMENTS

| 5,949,261 A | * | 9/1999 | Field .................. H03L 3/00 327/142 |
| 6,466,058 B1 | | 10/2002 | Goldman |
| 6,570,421 B1 | * | 5/2003 | Gauthier .............. H03L 7/0893 327/156 |
| 6,744,324 B1 | * | 6/2004 | Adams ................ H03F 1/0277 327/156 |
| 6,763,079 B1 | * | 7/2004 | Iwamoto ........... G01R 31/31725 327/156 |
| 7,368,961 B2 | * | 5/2008 | Werner .................. G06F 1/04 327/156 |
| 7,564,283 B1 | * | 7/2009 | Logue .................. G06F 1/10 327/158 |
| 2005/0242852 A1 | | 11/2005 | Parker et al. |
| 2007/0205816 A1 | * | 9/2007 | Kim .................... H03L 7/0812 327/156 |
| 2009/0273371 A1 | | 11/2009 | Atsumi |
| 2011/0181326 A1 | | 7/2011 | Sanchez et al. |
| 2013/0120072 A1 | * | 5/2013 | Murphy ............... H03L 7/0891 331/17 |
| 2014/0266347 A1 | * | 9/2014 | Iyer ..................... H03L 7/10 327/158 |
| 2015/0222278 A1 | * | 8/2015 | Reichelt ................ H03L 7/18 327/156 |

* cited by examiner

*Primary Examiner* — Adam D Houston
(74) *Attorney, Agent, or Firm* — Slater Matsil, LLP

(57) ABSTRACT

A method can be used for managing the operation of a phase-locked loop. The loop includes an oscillator voltage controlled by a control signal and a phase comparator receiving a reference signal and a feedback signal which arises from the output signal of the oscillator. The method includes a detection of a possible absence of transitions on the feedback signal for a first duration and, in response to such an absence, a forcing of the lowering of the voltage of the control signal at least until a reappearance of transitions on the feedback signal.

21 Claims, 3 Drawing Sheets

METHOD FOR MANAGING A PHASE-LOCKED LOOP AND RELATED CIRCUIT

CROSS-REFERENCE TO RELATED APPLICATIONS

This application claims priority to French Patent Application No. 1852413, filed on Mar. 21, 2018, which application is hereby incorporated herein by reference.

TECHNICAL FIELD

Modes of implementation and embodiments of the invention relate to a method for managing a phase-locked loop and related circuit.

BACKGROUND

Phase-locked loops are generally used in digital systems requiring a significant internal working frequency, for example of the order of several hundred megahertz.

The role of phase-locked loops is therefore in particular to deliver to these digital systems, for example a programmable core or a microprocessor, an internal clock signal having a significant working frequency.

Disturbances such as for example electromagnetic and/or electrostatic disturbances can arise on startup and/or during the operation of the phase-locked loop.

These disturbances are all the more troublesome as they can lead to the absence of the feedback signal arising from the output signal of the oscillator of the phase-locked loop and intended for the loop's phase comparator.

The phase-locked loop is then considered to be in an off state.

In order to turn the phase-locked loop back on and thus receive the feedback signal arising from the output signal of the oscillator of the phase-locked loop, it is known to undertake a complete reinitialization of the system, in particular of the microprocessor, this not constituting a satisfactory solution.

SUMMARY

Embodiments of the invention can be used to detect a possible absence of transitions on the feedback signal of the phase-locked loop and to restore the operation of the phase-locked loop and to do so without reinitializing it.

Modes of implementation and embodiments of the invention relate to integrated circuits, and phase-locked loops in particular, and more especially the management of their operation, for example when they turn off.

According to one aspect, there is proposed a method for managing the operation of a phase-locked loop. The loop comprises an oscillator voltage controlled by a control signal and a phase comparator receiving a reference signal and a feedback signal which arises from the output signal of the oscillator. The method comprises a detection of a possible absence of transitions on the feedback signal for a first duration and, in response to such an absence, a forcing of the lowering of the voltage of the control signal at least until a reappearance of transitions on the feedback signal.

The absence of transitions on the feedback signal is in particular due to too high a frequency of the voltage-controlled oscillator, for example a frequency of around 2.2 GHz, whilst its frequency during normal operation is for example of the order of 200 MHz. This absence is in particular related to the fact that the logic part internal to the phase-locked loop cannot operate at 2.2 GHz.

The oscillator's control signal has a direct influence on the voltage-controlled oscillator. Indeed, increasing the voltage of the control signal leads to increasing the frequency of the voltage-controlled oscillator which will then for example climb to a frequency of much greater than 2.2 GHz. The system turns off all the more.

It is therefore advantageous to decrease the frequency of the voltage-controlled oscillator until it drops below a certain frequency threshold which will allow the logic part of the phase-locked loop in particular to operate again and therefore the reappearance of transitions on the feedback signal.

The frequency threshold below which the transitions may reappear may be for example of the order of 1.6 GHz. But of course this threshold depends in particular on the components used.

That said, so as to be certain that there is an absence of transitions on the feedback signal, and thus to circumvent spiky absences of transitions due for example to parasitic phenomena, it is preferable to wait for a first duration for which no transitions are detected thereby offering a better guarantee as regards the turned-off character of the loop.

Next, on completion of this first duration, the lowering of the voltage of the control signal of the oscillator is forced at least until a reappearance of the transitions is obtained, and therefore until the loop is turned back on.

Thus, the transitions on the feedback signal reappear and do so without reinitializing the system, in particular the phase-locked loop and the microprocessor.

The absence of transitions on the feedback signal could be due also to a zero voltage of the control signal of the voltage-controlled oscillator. In order to discard this probability, it is particularly advantageous to create for the oscillator a minimum operating frequency or "base frequency."

This can be obtained, for example, by connecting a component, in particular a resistor, between the drain of a transistor receiving the control signal and the ground.

Thus, according to one mode of implementation, the voltage-controlled oscillator is configured in such a way that it exhibits a minimum operating frequency.

As indicated hereinabove, this makes it possible to ensure that the absence of transitions on the feedback signal is due to external disturbances and not to a zero voltage of the control signal.

By way of indication, this minimum frequency of the output signal of the oscillator can be of the order of 200 kHz.

The person skilled in the art will know how to choose the value of the first duration as a function in particular of the characteristics of the components of the loop, especially the frequency divider as well as of the base frequency.

By way of indication, the first duration can be between 10 μs and 200 μs.

That said, the reappearance of transitions on the feedback signal can further lead to disturbances at the level of the phase-locked loop. Indeed, despite the lowering of the voltage of the control signal leading to the decreasing of the frequency of the voltage-controlled oscillator and to the reappearance of the transitions, the frequency may remain high for the components of the phase-locked loop, in particular its logic part, and further lead to malfunctions.

It is therefore preferable to provide a second duration for which one continues to force the lowering of the voltage of the control signal so that the components, for example the frequency divider, become fully operational again.

Thus, according to one mode of implementation, the method comprises a forcing of the lowering of the voltage of the control signal until the expiry of a second duration after the reappearance of transitions on the feedback signal.

The person skilled in the art will know how to choose the value of the second duration as a function of the architecture of the circuit and of its components.

By way of indication, the second duration can be between 1 μs and 40 μs.

On completion of this second duration, the frequency of the output signal of the oscillator, frequency at which the digital (logic) part in particular operates again, is for example less than a GHz.

According to one mode of implementation, after the expiry of the second duration, the control voltage is driven on the basis of the output signals of the phase comparator.

The expiry of the second duration leads to normal operation of the phase-locked loop. There is no longer any need to force the lowering of the control signal. The control signal will thus be driven on the basis of the output signals of the phase comparator as provided during normal operation of the phase-locked loop.

According to one mode of implementation, the method can comprise a generating of an auxiliary signal representative of a malfunction of the phase-locked loop after the expiry of the first duration, for example when the phase-locked loop is no longer in its startup phase.

By auxiliary signal is meant for example an alarm signal making it possible to notify a component connected to the phase-locked loop, for example a (micro)processor, of a malfunction of the phase-locked loop.

The person skilled in the art will know how to define, once the auxiliary signal has been received by the component connected to the phase-locked loop, an appropriate behavior of the component, depending on the applications.

The malfunction of the phase-locked loop can occur during the startup phase of the phase-locked loop (stabilization phase) or else later during normal operation thereof.

Generally a phase-locked loop is configured to generate on completion of the startup phase a signal indicating that it is ready to operate.

When the loop is ready, the processor can then for example toggle on the clock signal (output signal) delivered by the oscillator of the loop.

That said, if the malfunction of the loop occurs during the startup phase, it may be unnecessary to inform the processor of this, since in any case the signal indicating that the loop is ready to operate is not delivered.

Thus, according to one mode of implementation, the phase-locked loop comprises a startup phase on completion of which an information signal is generated indicating that the phase-locked loop is ready to operate, and the auxiliary signal is not generated as long as the information signal is not emitted.

According to one mode of implementation, the detection of the possible absence of transitions on the feedback signal for the first duration can be performed with the aid of a counter.

More precisely, this detection can comprise a triggering of a counter, a counting of the pulses of the reference signal, a reinitializing of the counter upon the occurrence of some at least of the transitions on the feedback signal, and the attaining of a first counting value corresponding to the first duration.

The reinitialization of the counter can thus be performed upon the occurrence of solely positive transitions, of solely negative transitions or of each transition (positive and negative).

Stated otherwise, there is detection of the possible absence of transitions on the feedback signal if the first counting value is attained. On the other hand, if there is occurrence of a transition of the feedback signal, the counter reinitializes itself. This means to say that the phase-locked loop is not considered to be in an off state.

According to another aspect, an integrated circuit comprises a phase-locked loop comprising an oscillator configured to be voltage controlled by a control signal and a phase comparator configured to receive a reference signal and a feedback signal which arises from the output signal of the oscillator. A detector is configured to detect a possible absence of transitions on the feedback signal for a first duration. A controller is configured to force the lowering of the voltage of the control signal, in response to such an absence, at least until a reappearance of transitions on the feedback signal.

According to one embodiment, the voltage-controlled oscillator comprises circuitry configured to generate a minimum operating frequency for the oscillator.

According to one embodiment, the controller is configured to force the decreasing of the voltage of the control signal until the expiry of a second duration after the reappearance of transitions on the feedback signal.

According to one embodiment, the controller is configured to permit the driving of the voltage of the control signal on the basis of the output signals of the phase comparator after the expiry of the second duration.

According to one embodiment, the controller is configured to generate an auxiliary signal after the expiry of the first duration, the auxiliary signal being representative of a malfunction of the phase-locked loop.

According to one embodiment, the phase-locked loop comprises a startup phase on completion of which it is configured to generate an information signal indicating that it is ready to operate, and the controller is configured to not generate the auxiliary signal as long as the information signal is not emitted.

According to one embodiment, the detector comprises a first counter able to count pulses of the reference signal until the attaining of a first counting value corresponding to the first duration, and the controller is able to perform a reinitializing of the counter upon the occurrence of some at least of the transitions on the feedback signal.

According to one embodiment, the controller comprises a second counter able to count, after the expiry of the first duration, the pulses of the reference signal until the attaining of a second counting value corresponding to the second duration, the second counter having a reinitialization input coupled to the output of the first counter.

According to one embodiment, the controller comprises a first logic gate receiving on a first input the output signal of the first counter and on its second input a first command signal arising from the phase comparator. a second logic gate receives on a first input the output signal of the first counter and on its second input a second command signal arising from the phase comparator.

According to one embodiment the integrated circuit furthermore comprises a microprocessor having an input connected to the output terminal of the oscillator.

According to one embodiment, the microprocessor is configured to also receive the auxiliary signal.

BRIEF DESCRIPTION OF THE DRAWINGS

Other advantages and characteristics of the invention will become apparent on examining the detailed description of the wholly non-limiting modes of implementation and embodiments of the invention and the appended drawings in which.

DETAILED DESCRIPTION OF ILLUSTRATIVE EMBODIMENTS

Figure 1:
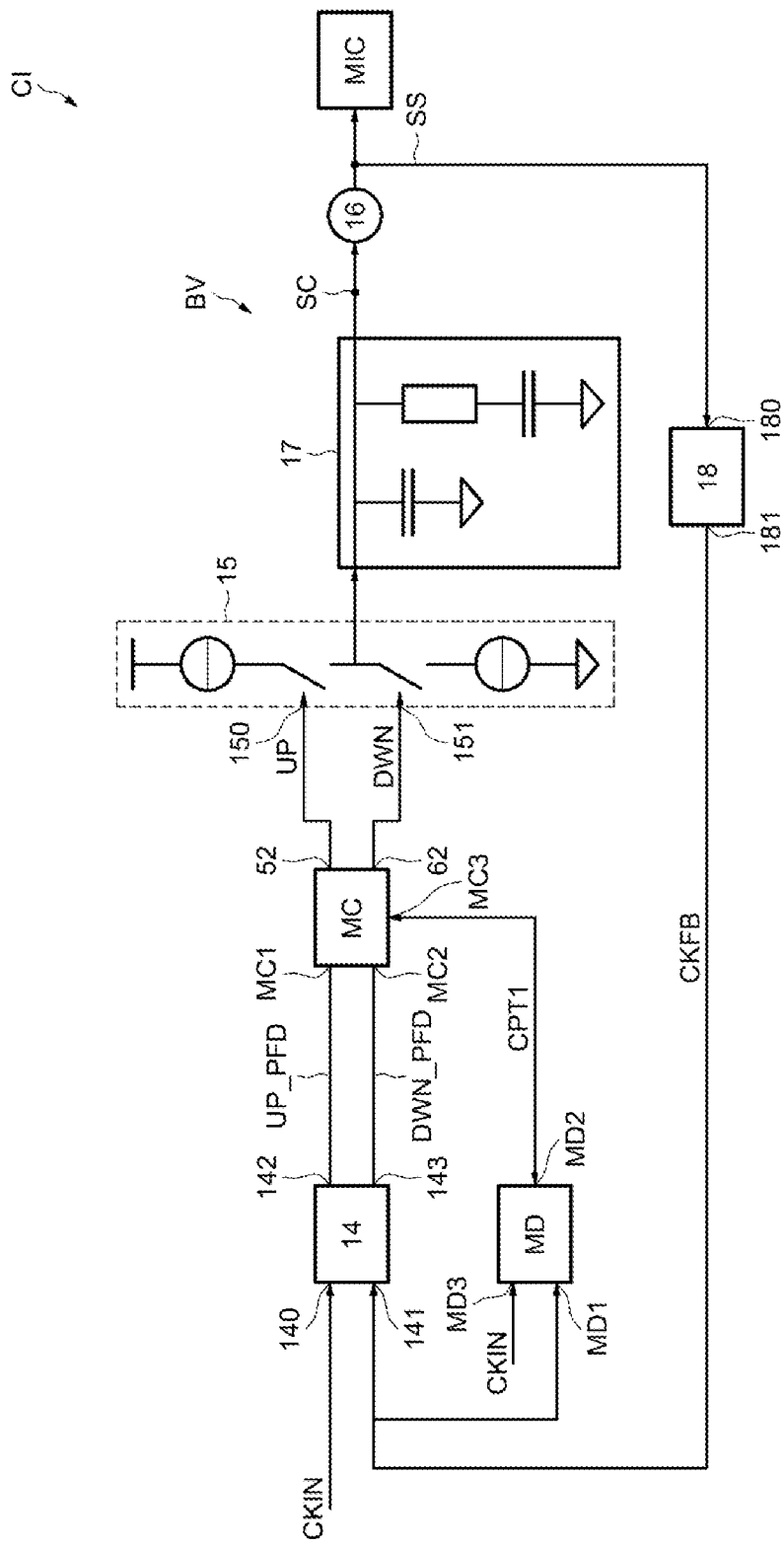
FIGS. 1 to 5 schematically illustrate various modes of implementation and embodiments of the invention.

FIG. 1 represents an integrated circuit CI comprising a phase-locked loop BV connected to a programmable core or (micro)processor MIC, for example that marketed by the company STMicroelectronics under the reference STM32.

The phase-locked loop BV comprises an oscillator 16 voltage controlled by a control signal SC and configured to deliver an output signal SS.

This output signal SS can form, for example, a clock signal for the microprocessor MIC. The frequency of this signal may be for example of the order of 200 MHz during normal operation.

The output signal SS is dispatched to an input terminal 180 of a fractional divider 18, for example a divider by 12, which delivers on its output terminal 181 a feedback signal CKFB, arising from the output signal SS.

The signal CKFB is received on a first input terminal 141 of a phase comparator 14 of conventional structure known per se.

The phase comparator 14 also comprises a second input terminal 140 configured to receive a reference signal CKIN, typically a reference clock signal arising for example from a quartz, a first output terminal 142 configured to deliver a signal UP_PFD, and a second output terminal 143 configured to deliver a signal DWN_PFD.

In a conventional manner, the UP_PFD and DWN_PFD signals are commands intended to make the voltage of the control signal SC of the oscillator 16 increase or decrease.

The signal CKFB is also received on a first input terminal MD1 of the detector MD configured also to receive the reference signal CKIN on a second input terminal MD3.

The detector MD is able to detect a possible absence of transitions on the feedback signal CKFB for a first duration.

The absence of transitions on the feedback signal CKFB is due for example to too high a frequency of the output signal of the voltage-controlled oscillator 16 in particular for the fractional divider 18, caused by one or more disturbances in the normal operation of the phase-locked loop BV.

This absence of transitions on the signal CKFB can occur, for example, when the frequency of the output signal SS exceeds 1.6 or 1.7 GHz.

It is therefore advantageous to decrease the frequency of the output signal of the voltage-controlled oscillator 16 until it drops below a first threshold, for example 1.6 GHz.

Accordingly, the phase-locked loop also comprises control circuitry MC configured to receive on a first input terminal MC1 the signal UP_PFD, on a second input terminal MC2 the DWN_PFD signal and on a third output terminal MC3 a signal CPT1 delivered by the detector MD and the meaning of which will be returned to in greater detail hereinafter.

The control circuitry MC delivers on a first output terminal 52 a signal UP and on a second output terminal 62 a signal DWN.

The signal UP is a command making it possible to raise the voltage of the control signal SC and therefore to increase the frequency of the voltage-controlled oscillator 16.

The signal DWN is a command making it possible to lower the voltage of the control signal SC and therefore to decrease the frequency of the voltage-controlled oscillator 16.

As will be seen in greater detail hereinafter, the control circuitry MC is configured to force the lowering of the voltage of the control signal SC in response to the possible absence of transitions on the feedback signal CKFB for a first duration, and to do so at least until the reappearance of transitions on the feedback signal CKFB.

The signal UP is received on a first input terminal 150, and the signal DWN is received on a second input terminal 151 of a charge pump circuit 15 of conventional structure.

The output of the charge pump circuit 15 is coupled to the control input of the oscillator 16 by a loop filter 17 of conventional structure.

The filter 17 is configured to deliver as output the control signal SC.

Figure 2:
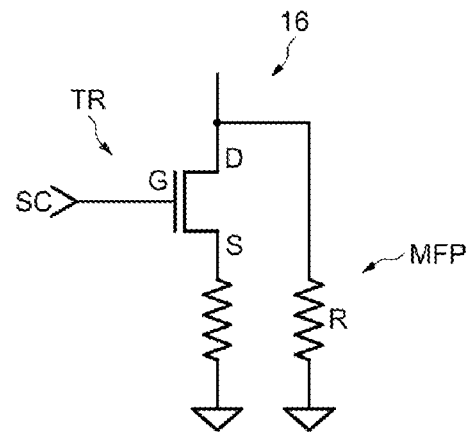

So as to prevent the oscillator 16 from delivering a feedback signal CKFB devoid of transitions in response to a zero control signal SC, provision is advantageously made, as illustrated in FIG. 2, for the oscillator to comprise circuitry MFP configured to ensure it a minimum operating frequency, or base frequency.

In the example described here the circuitry MFP comprises a resistor R connected between the drain D of the transistor TR receiving the control signal SC and the ground.

Thus, even if the control signal SC has a zero voltage, the output signal of the oscillator will exhibit a minimum frequency.

Figure 3:
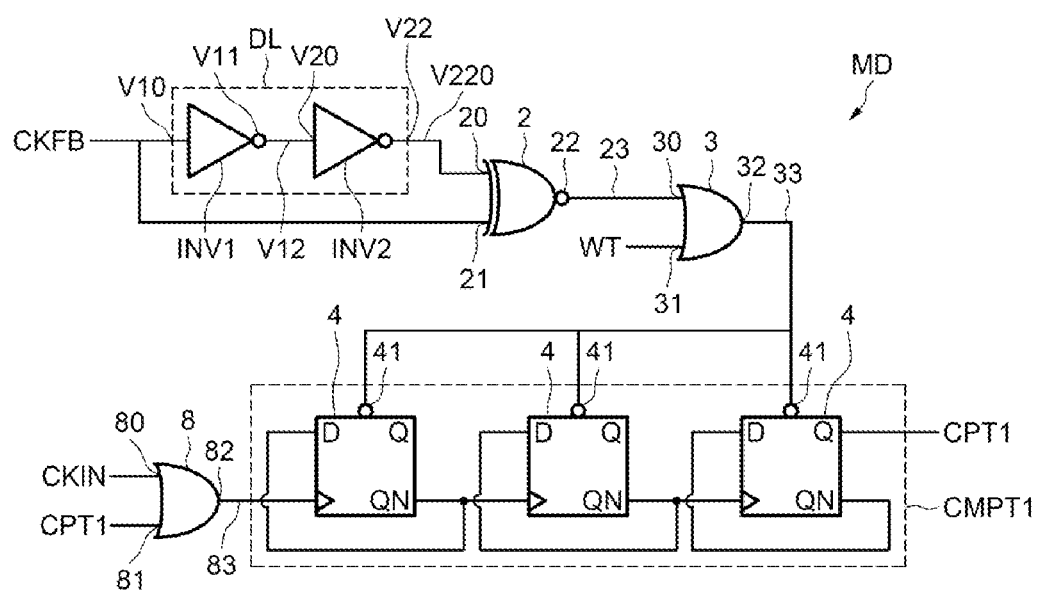

Reference is now made more particularly to FIG. 3, which illustrates an exemplary embodiment of the detector MD.

The detector MD comprise a circuit DL configured to receive on an input terminal V10 the feedback signal CKFB and to deliver on output terminal V22 a signal V220.

The circuit DL is a delay circuit and comprises a first inverter INV1 configured to receive on the input terminal V10 the feedback signal CKFB and configured to deliver on an output terminal V11 the signal V12.

The signal V12 is received on an input terminal V20 of a second inverter INV2 which delivers on an output terminal V22 the signal V220.

The signal V220 is received on a first input terminal 20 of an EXCLUSIVE NOR logic gate 2 which is also configured to receive on a second input terminal 21 the feedback signal CKFB and to deliver the signal 23 on an output terminal 22. The inverters INV1, INV2 and the EXCLUSIVE NOR logic gate 2 allow detection of rising and falling edges.

That said, such detection can be carried out by any other known circuit. Furthermore, a circuit detecting rising-only edges or falling-only edges can replace these logic gates.

The signal 23 is received on a first input terminal 30 of an OR logic gate 3 configured to also receive on a second input terminal 31 a signal WT. The logic gate 3 delivers on an output terminal 32 the signal 33.

The detector MD also comprises a first counter CMPT1 comprising n flip-flops 4.

The number n is chosen in such a way that the final counting value of the first counter CMPT1 corresponds to the first duration.

Each flip-flop 4 of the counter CMPT1 receives, on a reinitialization input 41, the signal 33 delivered by the output terminal 32 of the logic gate 3.

The last flip-flop 4 of the counter CMPT1 delivers as output the signal CPT1.

The reference signal CKIN is received on a first input terminal 80 of an OR logic gate 8 which is also configured to receive, on a second input terminal 81, the signal CPT1.

The logic gate 8 delivers, by an output terminal 82, the signal 83 which corresponds to the timing signal of the first counter CMPT1.

Figure 4:
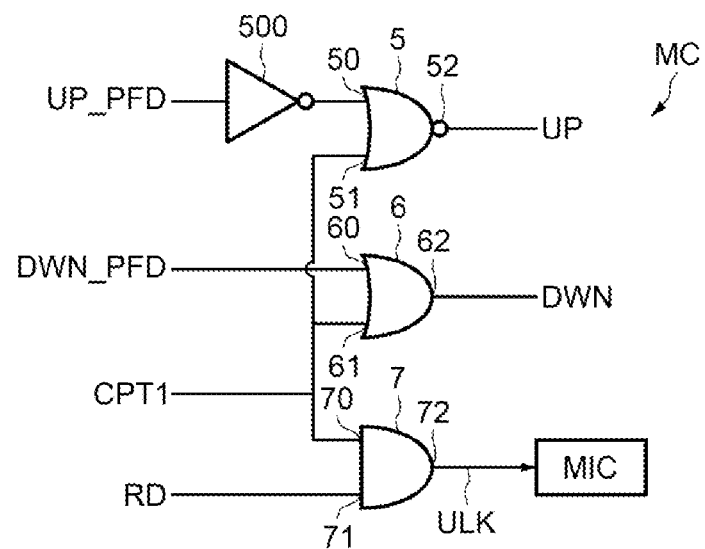
Figure 5:
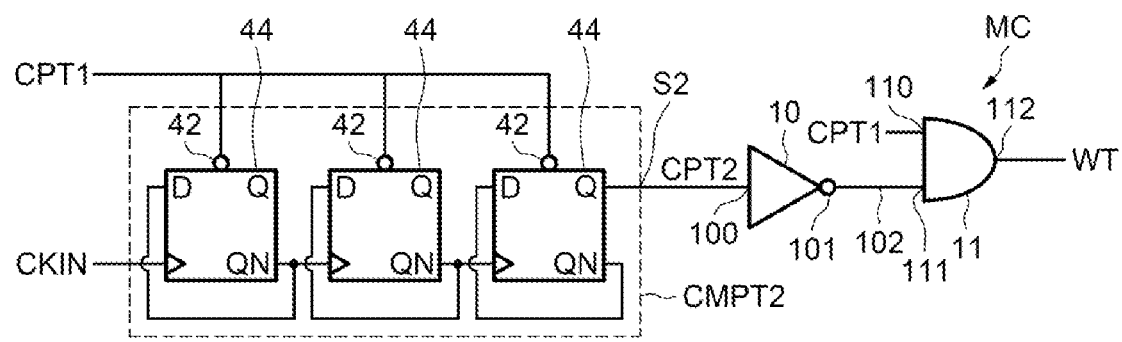

Reference is now made more particularly to FIGS. 4 and 5 which illustrate embodiments of the controller MC.

As illustrated in FIG. 4, the controller MC comprise a NOR logic gate 5, an OR logic gate 6 and an OR logic gate 7.

The logic gate 5 is configured to receive on a first input terminal 50 the signal UP_PFD inverted by an inverter 500, and on a second input terminal 51 the signal CPT1.

The logic gate 5 is also configured to deliver on its output terminal 52 the signal UP.

The signal UP is a command making it possible to raise the voltage of the control signal SC and therefore to increase the frequency of the voltage-controlled oscillator 16, when this signal is in a high state.

The logic gate 6 is configured to receive on a first input terminal 60 the signal DWN_PFD and on a second input terminal 61 the signal CPT1.

The logic gate 6 delivers on its output terminal 62 the signal DWN.

The signal DWN is a command making it possible to lower the voltage of the control signal SC and therefore to decrease the frequency of the voltage-controlled oscillator 16, when the signal is in a high state.

The logic gate 7 is configured to receive the signal CPT1 on a first input terminal 70 and an information signal RD on a second input terminal 71.

The information signal RD is generated in a conventional and known manner by the phase-locked loop on completion of a startup phase of the phase-locked loop BV.

It makes it possible to indicate that the phase-locked loop BV is ready to operate.

Typically as long as the signal RD is in the low state, the loop BV is in its startup phase, while when the signal RD passes to the high state, it is considered to indicate that the loop is ready to operate.

The logic gate 7 delivers on its output terminal 72 an auxiliary signal ULK.

The signal ULK is for example an alarm signal making it possible to notify the micro(processor) MIC of a malfunction that has arisen in the phase-locked loop BV.

For example, a signal ULK in the high state is representative of a malfunction of the phase-locked loop BV.

As illustrated in FIG. 5, the control circuitry MC can advantageously comprise a second counter CMPT2.

Although the second counter CMPT2 is not compulsory, this makes it possible to provide a hysteresis effect to restore the phase-locked loop BV to its normal operation. Indeed the reappearance of transitions on the feedback signal CKFB can lead to disturbances at the level of the phase-locked loop BV. It is therefore preferable to wait for a second duration, defined by the second counter, in order for the frequency of the oscillator 16 to have dropped sufficiently and to permit normal driving of the charge pump circuit on the basis of the UP_PFD and DWN_PFD signals delivered by the phase comparator.

The second counter CMPT2 comprises m flip-flops 44 linked in series, and delivers on an output terminal S2 a signal CPT2.

The number m is chosen in such a way that the final counting value of the counter CMPT2 corresponds to the second duration.

Each flip-flop 44 receives on its reinitialization input 42 the signal CPT1 delivered by the last flip-flop 4 of the first counter CMPT1.

The signal CPT2 is received on an input terminal 100 of an inverter 10 which delivers on its output terminal 101 a signal 102.

The signal 102 is received on an input terminal 111 of an AND logic gate 11 which also receives on its input terminal 110 the signal CPT1.

The logic gate 11 delivers on its output terminal 112 the signal WT looped back to the input terminal 31 of the logic gate 3 of FIG. 3.

An exemplary implementation of a method according to the invention is described presently.

It is assumed firstly that the phase-locked loop BV is in normal operation. The feedback signal CKFB is in a high state ("1") or in a low state ("0"), signifying the presence of transitions.

When the feedback signal CKFB is in the high state, the signal V12 is in the low state.

The gate INV1 delivers via the output terminal V11 the signal V12 in the low state.

The signal V220 is in the high state.

The signal V220 is the delayed feedback signal CKFB.

The logic gate 2 which simultaneously receives the signal V220 in a high state, and the feedback signal CKFB in a low state, delivers via the output terminal 22 the signal 23 in a low state ("0").

The signal 23 will also be in a low state if the feedback signal CKFB received on the input terminal V10 of the inverter INV1 is in a low state.

The low state of the signal 23 signifies that there has been a transition on the feedback signal CKFB from a low state to a high state or a transition from a high state to a low state.

Thus, the logic circuit DL makes it possible to detect the presence of transitions on the feedback signal CKFB. It could be replaced with a logic circuit making it possible to detect positive-only transitions or negative-only transitions.

The signal 23 being in the low state, just like the signal WT as will be seen in greater detail hereinafter, the signal 33 is in the low state.

The signal 33 reinitializes the counter CMPT1 so that the counter CMPT1 does not continue to count, since the feedback signal CKFB is not absent.

The signal CPT1 is therefore in a low state.

Consequently, the signal DWN delivered by the gate 6 corresponds to the signal DWN_PFD.

The signal UP delivered by the gate 5 corresponds to the inverse of the inverted signal UP_PFD and therefore to the signal UP_PFD.

Consequently, the charge pump 15 is indeed commanded by the signals UP_PFD and DWN_PFD delivered by the phase comparator 14.

The auxiliary signal ULK is for its part in the low state, not therefore indicating a malfunction of the phase-locked loop BV.

The signal CPT1 being in the low state, the second counter CMPT2 is reinitialized and the signal WT is in the low state.

Now, it is assumed that subsequent to disturbances leading to too high a frequency of the output signal SS of the voltage-controlled oscillator 16, the transitions on the feedback signal CKFB disappear.

The feedback signal CKFB is then for example in a permanent low state.

The signal 23 delivered by the output terminal 22 is therefore in a high state.

Consequently, the signal 33 delivered by the output terminal 32 is also in a high state, which does not reinitialize the counter CMPT1. The latter will therefore count the pulses of the reference signal CKIN until the expiry of the first duration.

On the expiry of the first duration, the detector MD does indeed detect that there is an absence of transitions on the feedback signal CKFB.

The signal CPT1 passes to the high state and makes it possible to deliver via the output terminal 82 the signal 83 constantly in the high state, thereby turning off the counter CMPT1.

The signal CPT1 also being received in the high state on the input terminal 110 of the logic gate 11, the latter delivers the signal WT in a high state since the signal 102 is in a high state because the output CPT2 of the counter CMPT2 is at "0".

The signal WT in the high state makes it possible to avoid reinitializing the counter CMPT1 by holding the signal 33 at "1" and therefore to prevent the detection of transitions on the feedback signal CKFB.

The signal CPT1 in the "1" state does not reinitialize the counter CMPT2 and the latter will count until its counting value corresponding to the second duration.

As illustrated in FIG. 3, the signal CPT1 being in the high state, the signal UP delivered by the output terminal 52 is in the low state.

The signal DWN delivered by the output terminal 62 is in the high state.

Thus the controller MC forces the lowering of the voltage of the control signal SC.

That said, despite the lowering of the voltage of the control signal SC leading to the decreasing of the frequency of the voltage-controlled oscillator 16 and to the reappearance of the transitions, the frequency may remain high for certain components of the phase-locked loop BV, in particular the divider 18, and lead to malfunctions.

It is accordingly desirable to provide the second duration so as to allow the frequency of the oscillator to decrease sufficiently for the components of the phase-locked loop BV, for example the frequency divider 18, to become functional again.

On the expiry of the second duration, the signal CPT2 is in the high state and the signal 102 is in the low state.

The signal CPT1 being in the high state and the signal 102 in the low state, the logic gate 11 delivers the signal WT in the low state.

WT being in the low state, the detection of the transitions on the feedback signal CKFB is possible again.

And as soon as there is a new detection of transition on the signal CKFB, the first counter CMPT1 will be reinitialized, causing the signal CPT1 to pass to the low state again.

Thus, the phase-locked loop BV has regained normal operation without it being necessary to reinitialize the system, and in particular the microprocessor MIC, whether this be during the loop startup phase or later.

As regards the signal ULK, the following should be noted.

If the signal RD is in the high state, indicating for example that the phase-locked loop is ready, when the signal CPT1 passes to the high state, the signal ULK passes to the high state indicating a malfunction of the phase-locked loop BV.

That said, as the microprocessor no longer perceives the output signal of the loop (and therefore its clock signal), it will be unaware of this malfunction until the loop has been turned back on.

It is then possible as a variant to provide an auxiliary circuit receiving the signal ULK and allowing the microprocessor to switch to another internal clock signal while waiting for the restoration of the phase-locked loop.

If the signal RD is at 0, that is to say if the phase-locked loop is not yet ready, the signal ULK remains at 0 since it is unnecessary to inform the microprocessor that there is a malfunction of the phase-locked loop BV.

The invention is not limited to these modes of implementation and embodiments but embraces all variants thereof.

For example, it is possible to replace the counter CMPT1 and the counter CMPT2 by timeout circuits.

What is claimed is:

1. A method for managing the operation of a phase-locked loop that comprises an oscillator that is controlled by a voltage of a control signal and a phase comparator that receives a reference signal and a feedback signal that arises from an output signal of the oscillator, the method comprising:
    detecting an absence of transitions on the feedback signal for a first duration; and
    in response to the absence of transitions, forcing the voltage of the control signal to be lowered at least until a reappearance of transitions on the feedback signal.

2. The method according to claim 1, wherein the oscillator is configured to exhibits a minimum operating frequency.

3. The method according to claim 1, wherein forcing the voltage of the control signal to be lowered comprises forcing the voltage of the control signal to be lowered until expiration of a second duration after the reappearance of transitions on the feedback signal.

4. The method according to claim 3, wherein after expiration of the second duration, the voltage of the control signal is driven based on output signals of the phase comparator.

5. The method according to claim 3, further comprising, after expiration of the first duration, generating an auxiliary signal representative of a malfunction of the phase-locked loop.

6. The method according to claim 5, wherein the phase-locked loop comprises a startup phase on completion of which an information signal is generated indicating that the phase-locked loop is ready to operate, and wherein the auxiliary signal is not generated as long as the information signal is not emitted.

7. The method according to claim 1, wherein detecting the absence of transitions on the feedback signal for the first duration comprises:
    triggering of a counter;
    counting pulses of the reference signal;
    reinitializing the counter upon occurrence of some of the transitions on the feedback signal; and
    attaining a first counting value corresponding to the first duration.

8. An integrated circuit comprising:
    a phase-locked loop comprising an oscillator configured to be controlled by a voltage a control signal;
    a phase comparator configured to receive a reference signal and a feedback signal that arises from an output signal of the oscillator;

a detector configured to detect an absence of transitions on the feedback signal for a first duration; and a controller configured to force the voltage of the control signal to be lowered in response to the absence of transitions on the feedback signal at least until a reappearance of transitions on the feedback signal.

9. The integrated circuit according to claim 8, wherein the oscillator comprises circuitry configured to generate a minimum operating frequency for the oscillator.

10. The integrated circuit according to claim 8, wherein the controller is configured to force the voltage of the control signal to be lowered until expiration of a second duration after the reappearance of transitions on the feedback signal.

11. The integrated circuit according to claim 10, wherein the controller is configured to permit the voltage of the control signal to be driven based on output signals of the phase comparator after the expiration of the second duration.

12. The integrated circuit according to claim 10, wherein the controller is configured to generate an auxiliary signal after the expiration of the first duration, the auxiliary signal being representative of a malfunction of the phase-locked loop.

13. The integrated circuit according to claim 12, wherein the phase-locked loop comprises a startup phase on completion of which the phase-locked loop is configured to generate an information signal indicating that the phase-locked loop is ready to operate, and wherein the controller is configured to not generate the auxiliary signal as long as the information signal is not emitted.

14. The integrated circuit according to claim 12, further comprising a microprocessor having an input connected to an output terminal of the oscillator, wherein the microprocessor is configured to also receive the auxiliary signal.

15. The integrated circuit according to claim 8, wherein the detector comprises a first counter configured to count pulses of the reference signal until attaining a first counting value corresponding to the first duration, and the controller is configured to perform a reinitializing of the counter upon occurrence of some of the transitions on the feedback signal.

16. The integrated circuit according to claim 15, wherein the controller is configured to force the voltage of the control signal to be lowered until expiration of a second duration after the reappearance of transitions on the feedback signal and wherein the controller comprises a second counter configured to count, after expiration of the first duration, the pulses of the reference signal until attaining a second counting value corresponding to the second duration, the second counter having a reinitialization input coupled to the output of the first counter.

17. The integrated circuit according to claim 15, wherein the controller comprises a first logic gate having a first input coupled to receive the output signal of the first counter and a second input coupled to receive a first command signal arising from the phase comparator, the controller further comprising a second logic gate have a first input coupled to receive the output signal of the first counter and a second input coupled to receive a second command signal from the phase comparator.

18. The integrated circuit according to claim 8, further comprising a microprocessor having an input connected to an output terminal of the oscillator.

19. An integrated circuit comprising:
a phase-locked loop comprising an oscillator configured to be controlled by a voltage a control signal;
a phase comparator configured to receive a reference signal and a feedback signal that arises from an output signal of the oscillator;
a detector configured to detect an absence of transitions on the feedback signal for a first duration, the detector comprising a first counter configured to count pulses of the reference signal until attaining a first counting value corresponding to the first duration; and
a controller configured to force the voltage of the control signal to be lowered in response to the absence of transitions on the feedback signal, the control signal being lowered until expiration of a second duration after a reappearance of transitions on the feedback signal.

20. The integrated circuit according to claim 19, wherein the controller is configured to generate an auxiliary signal after the expiration of the first duration, the auxiliary signal being representative of a malfunction of the phase-locked loop.

21. The integrated circuit according to claim 19, wherein the controller is configured to perform a reinitializing of the counter upon occurrence of some of the transitions on the feedback signal.

* * * * *